United States Patent
Fu et al.

(10) Patent No.: US 10,705,268 B2
(45) Date of Patent: Jul. 7, 2020

(54) GAP FILL OF IMPRINTED STRUCTURE WITH SPIN COATED HIGH REFRACTIVE INDEX MATERIAL FOR OPTICAL COMPONENTS

(71) Applicant: Applied Materials, Inc., Santa Clara, CA (US)

(72) Inventors: Jinxin Fu, Fremont, CA (US); Ludovic Godet, Sunnyvale, CA (US); Wayne McMillan, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 38 days.

(21) Appl. No.: 16/120,733

(22) Filed: Sep. 4, 2018

(65) Prior Publication Data
US 2020/0003936 A1    Jan. 2, 2020

Related U.S. Application Data
(60) Provisional application No. 62/692,247, filed on Jun. 29, 2018.

(51) Int. Cl.
*B29D 11/00*     (2006.01)
*G02B 5/18*       (2006.01)
*G03F 7/00*       (2006.01)

(52) U.S. Cl.
CPC ...... *G02B 5/1852* (2013.01); *B29D 11/00875* (2013.01); *G03F 7/0002* (2013.01);
(Continued)

(58) Field of Classification Search
None
See application file for complete search history.

(56) References Cited

U.S. PATENT DOCUMENTS 6,144,795 A * 11/2000 Dawes ............... C03B 19/12
                                                            385/141
2004/0076391 A1* 4/2004 Ghoshal ............ G02B 1/046
                                                            385/123

(Continued)

FOREIGN PATENT DOCUMENTS

KR   10-2007-0036189 A   4/2007
KR   10-2012-0053318 A   5/2012
(Continued)

OTHER PUBLICATIONS

Lu, "Synthesis of PDMS-metal oxide hybrid nanocomposites using in situ sol-gel route", Michigan Technological University, 2012, pp. 1-203. (Year: 2012).*

(Continued)

*Primary Examiner* — Lisa L Herring
(74) *Attorney, Agent, or Firm* — Patterson + Sheridan LLP

(57) ABSTRACT

Embodiments of the present disclosure generally relate to a method for forming an optical component, for example, for a virtual reality or augmented reality display device. In one embodiment, the method includes forming a first layer on a substrate, and the first layer has a first refractive index. The method further includes pressing a stamp having a pattern onto the first layer, and the pattern of the stamp is transferred to the first layer to form a patterned first layer. The method further includes forming a second layer on the patterned first layer by spin coating, and the second layer has a second refractive index greater than the first refractive index. The second layer having the high refractive index is formed by spin coating, leading to improved nanoparticle uniformity in the second layer.

18 Claims, 7 Drawing Sheets

(52) U.S. Cl.
CPC ...... *G03F 7/0007* (2013.01); *B29D 11/00759* (2013.01); *B29D 11/00884* (2013.01)

(56) References Cited

U.S. PATENT DOCUMENTS

| | | | | |
|---|---|---|---|---|
| 2007/0107629 | A1* | 5/2007 | Zheng | C08G 77/06 |
| | | | | 106/187.1 |
| 2019/0187342 | A1* | 6/2019 | Hatakeyama | G02B 27/0172 |
| 2019/0369321 | A1* | 12/2019 | Young | B29D 11/0075 |

FOREIGN PATENT DOCUMENTS

| | | |
|---|---|---|
| KR | 10-2016-0025061 A | 3/2016 |
| KR | 10-2017-0075900 A | 7/2017 |
| WO | 2014/045595 A1 | 3/2014 |

OTHER PUBLICATIONS

PCT Notification of Transmittal of the International Search Report and the Written Opinion of the International Searching Authority for International Application No. PCT/US2019/033711; dated Aug. 29, 2019; 12 total pages.

\* cited by examiner

GAP FILL OF IMPRINTED STRUCTURE WITH SPIN COATED HIGH REFRACTIVE INDEX MATERIAL FOR OPTICAL COMPONENTS

CROSS-REFERENCE TO RELATED APPLICATIONS

This application claims priority to U.S. Provisional Patent Application Ser. No. 62/692,247, filed on Jun. 29, 2018, which herein is incorporated by reference.

BACKGROUND

Field

Embodiments of the present disclosure generally relate to display devices for augmented, virtual, and mixed reality. More specifically, embodiments described herein provide a method for forming an optical component for a display device.

Description of the Related Art

Virtual reality is generally considered to be a computer generated simulated environment in which a user has an apparent physical presence. A virtual reality experience can be generated in 3D and viewed with a head-mounted display (HMD), such as glasses or other wearable display devices that have near-eye display panels as lenses to display a virtual reality environment that replaces an actual environment.

Augmented reality enables an experience in which a user can still see through the display lenses of the glasses or other HMD device to view the surrounding environment, yet also see images of virtual objects that are generated for display and appear as part of the environment. Augmented reality can include any type of input, such as audio and haptic inputs, as well as virtual images, graphics, and video that enhances or augments the environment that the user experiences.

Both virtual reality and augmented reality display devices utilize optical components, such as waveguides or flat lens/meta surfaces, including a patterned layer having high refractive index (RI), such as 1.7 or higher. The refractive index is a ratio of the speed of light in a vacuum to the speed of light in the medium. Conventional method for forming the patterned high RI layer includes pressing a stamp having the pattern onto a layer of nanoparticles of the high RI material to transfer the pattern to the layer of nanoparticles. The resulting patterned high RI layer has either non-uniform dispersion of the nanoparticles in the patterned high RI layer or brittle structure due to weak bonding between nanoparticles.

Accordingly, an improved method for forming optical components for virtual reality or augmented reality display devices is needed.

SUMMARY

Embodiments of the present disclosure generally relate to a method for forming an optical component, for example, for a virtual reality or augmented reality display device. In one embodiment, a method includes forming a first layer having a first refractive index on a substrate, pressing a stamp having a pattern onto the first layer, transferring the pattern to the first layer to form a patterned first layer, and forming a second layer having a second refractive index greater than the first refractive index on the patterned first layer by spin coating.

In another embodiment, a method includes forming a first layer having a first refractive index ranging from about 1.1 to about 1.5, pressing a stamp having a pattern onto the first layer, transferring the pattern to the first layer to form a patterned first layer, and forming a second layer having a second refractive index ranging from about 1.7 to about 2.4 on the patterned first layer by spin coating.

In another embodiment, a method includes forming a first layer having a first refractive index on a first surface of a substrate, pressing a first stamp having a first pattern onto the first layer, transferring the first pattern to the first layer to form a patterned first layer, and forming a second layer having a second refractive index ranging from about 1.7 to about 2.4 on the patterned first layer by spin coating. The second layer includes a metal oxide.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to a method for forming an optical component, for example, for a virtual reality or augmented reality display device. In one embodiment, the method includes forming a first layer on a substrate, and the first layer has a first refractive index. The method further includes pressing a stamp having a pattern onto the first layer, and the pattern of the stamp is transferred to the first layer to form a patterned first layer. The method further includes forming a second layer on the patterned first layer by spin coating, and the second layer has a second refractive index greater than the first refractive index. The second layer having the high refractive index is formed by spin coating, leading to improved nanoparticle uniformity in the second layer.

Figure 1:
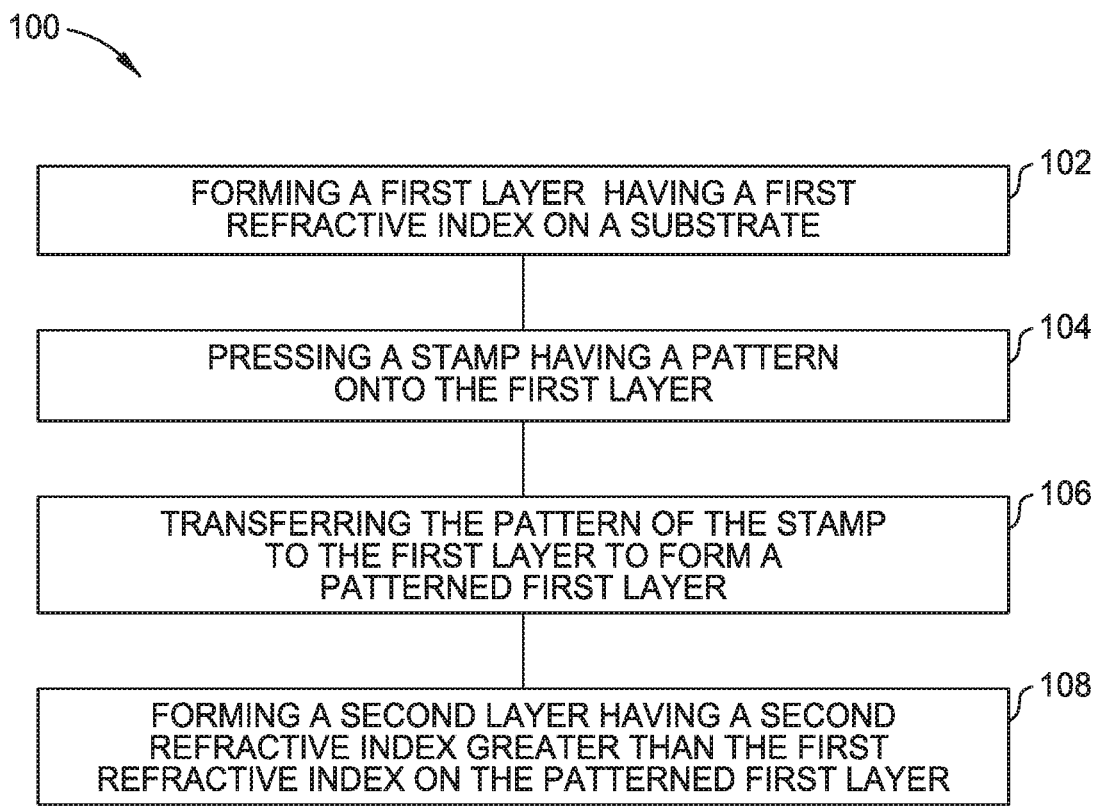
FIG. 1 is a flow diagram of a method for forming an optical component according to one embodiment described herein.
Figure 2A:
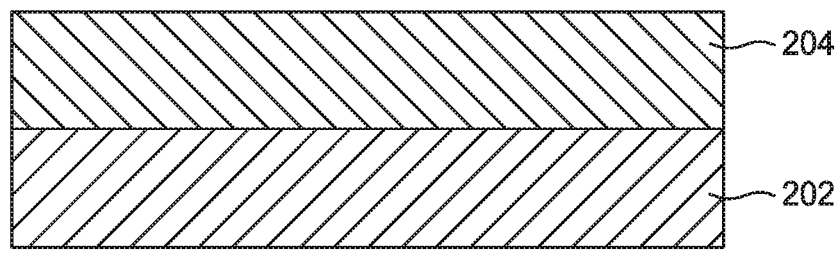
FIGS. 2A-2D illustrate schematic cross-sectional views of the optical component during different stages of the method of FIG. 1 according to one embodiment described herein.

FIG. 1 is a flow diagram of a method 100 for forming an optical component 200 according to one embodiment described herein. FIGS. 2A-2D illustrate schematic cross-sectional views of the optical component 200 during different stages of the method 100 of FIG. 1 according to one embodiment described herein. The method 100 starts at block 102 by forming a first layer 204 having a first RI on a substrate 202, as shown in FIG. 2A. In one embodiment, the substrate 202 is fabricated from a visually transparent material, such as glass. The substrate 202 has a RI ranging from about 1.4 to about 2.0. The first layer 204 is fabricated from a transparent material, and the first RI ranges from about 1.1 to about 1.5. In one embodiment, the RI of the substrate 202 is the same as the first RI of the first layer 204. In another embodiment, the RI of the substrate 202 is different from the first RI of the first layer 204. The first layer 204 is fabricated from porous silicon dioxide, quartz, or any suitable material. In one embodiment, the first layer 204 is formed on the substrate 202 by spin coating. For example, a solution including a silicon precursor is spin-coated onto the substrate 202 and then heated in oxygen environment to form the first layer 204. In some embodiments, there are no nanoparticles dispersed in the solution. The silicon precursor is dissolved in the solution.

Figure 2B:
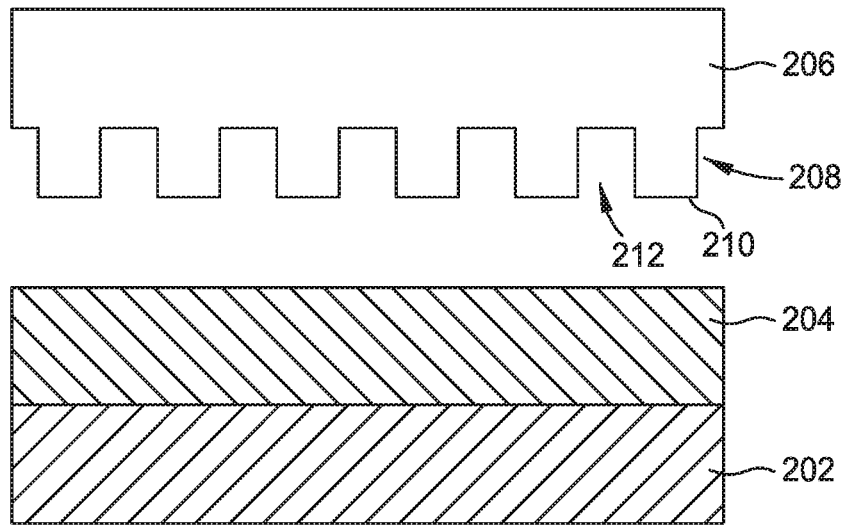

Next, at block 104, a stamp 206 having a pattern 208 is pressed onto the first layer 204, as shown in FIG. 2B. The stamp 206 is fabricated from any suitable material, such as silicon, quartz, glass, or a polymer. The polymer may be polyurethane, polybutadiene, polyisoprene, or poly(dimethylsiloxane) (PDMS). The pattern 208 formed on the stamp 206 may include a plurality of protrusions 210 and a plurality of gaps 212. Adjacent protrusions 210 are separated by a gap 212. The protrusions 210 may have any suitable shape. After the stamp 206 is pressed onto the first layer 204, a curing process may be performed to cure the first layer 204. The curing process may utilize UV light or thermal energy to cure the first layer 204.

Figure 2C:
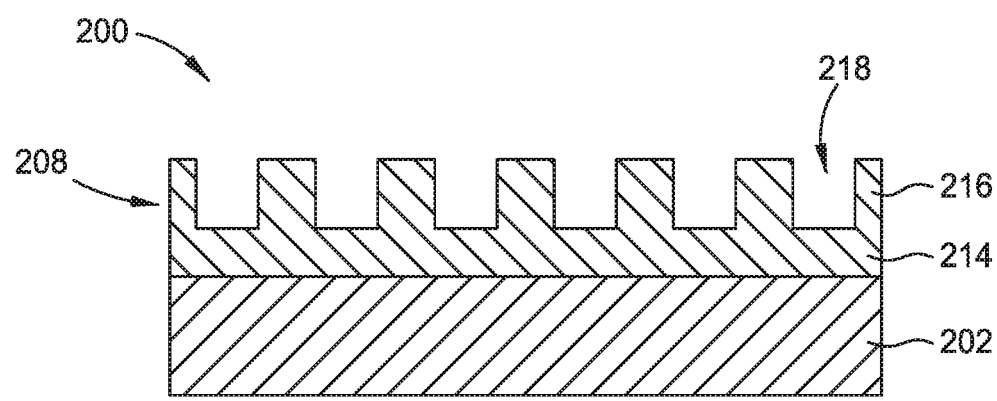

After the first layer 204 is cured, the stamp 206 is removed from the cured first layer 204, and the pattern 208 of the stamp 206 is transferred to the cured first layer 204 to form a patterned first layer 214, as shown at block 106 in FIG. 1 and in FIG. 2C. The pattern 208 of the patterned first layer 214 includes a plurality of protrusions 216 and a plurality of gaps 218. Adjacent protrusions 216 are separated by a gap 218. As shown in FIG. 2C, the protrusion 216 has a rectangular shape. The protrusion 216 may have any other suitable shape. Examples of the protrusion 216 having different shapes are shown in FIGS. 4A-4D. In one embodiment, the protrusions 216 are gratings. Gratings are a plurality of parallel elongated structures that splits and diffracts light into several beams traveling in different directions. Gratings may have different shapes, such as sine, square, triangle, or sawtooth gratings. Because the first layer 204, or the patterned first layer 214, does not contain any nanoparticles, there are no non-uniformity issues. Furthermore, the removal of the stamp 206 from the patterned first layer 214 does not damage the patterned first layer 214, because the patterned first layer 214 is not formed by packing nanoparticles.

Figure 2D:
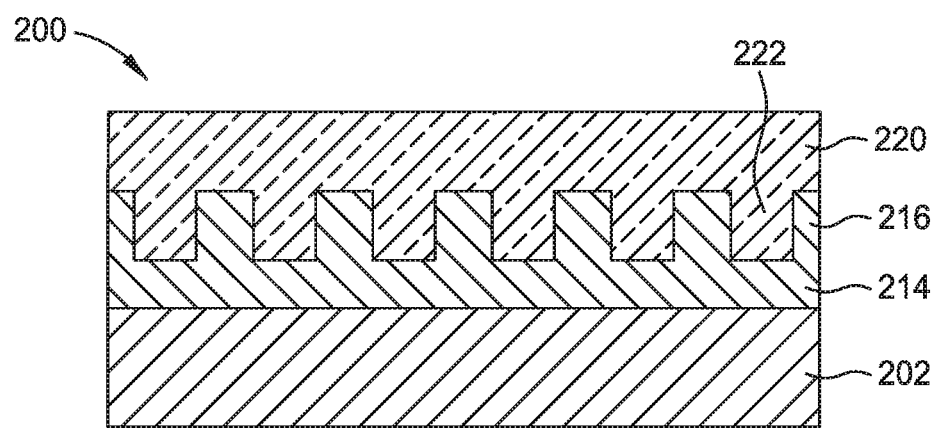

Next, at block 108, a second layer 220 having a refractive index greater than that of the first layer 204 is formed on the patterned first layer 214 by spin coating, as shown in FIG. 2D. The second layer 220 includes metal oxides, such as titanium oxide ($TiO_x$), tantalum oxide ($TaO_x$), zirconium oxide ($ZrO_x$), hafnium oxide ($HfO_x$), or niobium oxide ($NbO_x$). In one embodiment, the second layer 220 has a RI ranging from about 1.7 to about 2.4. In one embodiment, the second layer 220 includes nanoparticles of the metal oxides dispersed in a polymer matrix or a carrier liquid, and the nanoparticles are uniformly distributed throughout the second layer 220 due to the spin coating method. Furthermore, because the patterned first layer 214 has the pattern 208 formed thereon, the second layer 220 is also patterned as the second layer 220 is spin coated on the patterned first layer 214. As shown in FIG. 2D, the second layer 220 includes a plurality of protrusions 222, and each protrusion 222 is formed in a corresponding gap 218 (as shown in FIG. 2C) of the patterned first layer 214. The protrusions 216 of the patterned first layer 214 and the protrusions 222 of the second layer 220 are alternately positioned. Because the pattern of the second layer 220, i.e., the protrusions 222, are formed without using a stamp to press thereonto, the pattern of the second layer 220 is not damaged and the nanoparticles of the metal oxide material are uniformly distributed in the second layer 220.

After the spin coating of the second layer 220, a curing process may be performed to cure the second layer 220. The curing process of the second layer 220 may be the same as the curing process of the patterned first layer 214. The optical component 200 including layers having different RIs may be used in any suitable display devices. For example, in one embodiment, the optical component 200 is used as a waveguide or waveguide combiner in augmented reality display devices. Waveguides are structures that guide optical waves. Waveguide combiners are used in augmented reality display devices that combine real world images with virtual images. In another embodiment, the optical component 200 is used as a flat lens/meta surfaces in augmented and virtual reality display devices and 3D sensing devices, such as face ID and LIDAR.

Figure 3A:
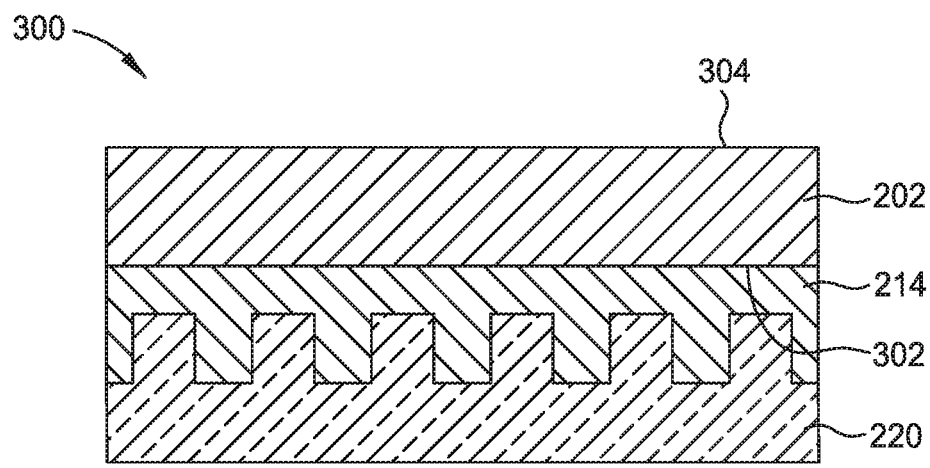
FIGS. 3A-3D illustrate schematic cross-sectional views of an optical component during different stages according to one embodiment described herein.
Figure 3B:
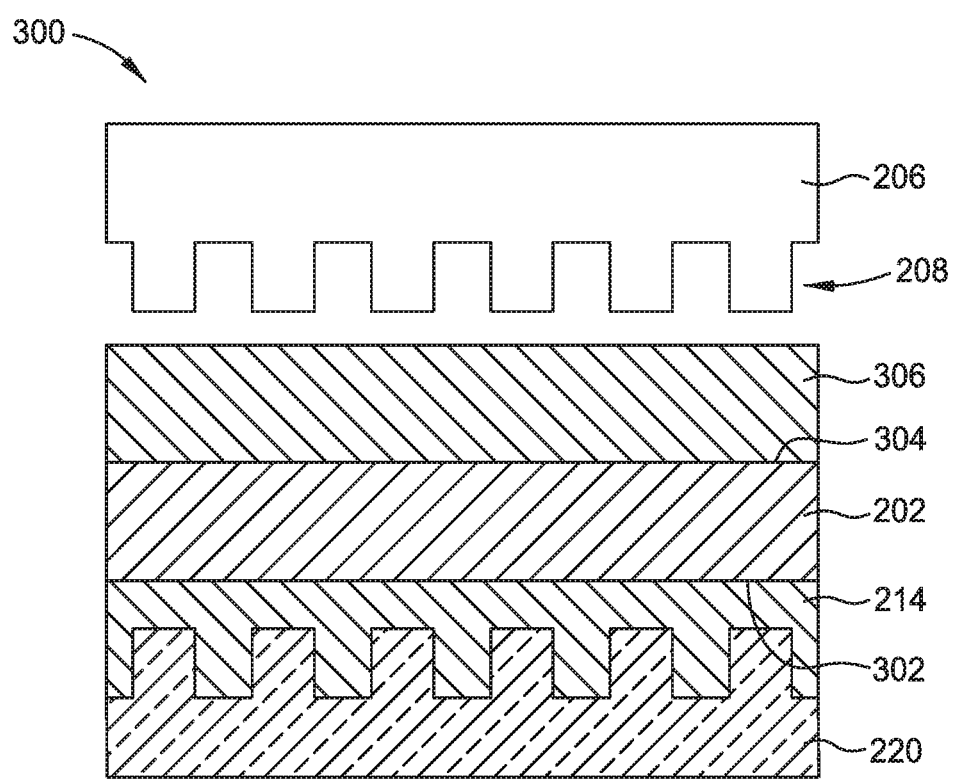

FIGS. 2A-2D illustrate the method 100 for forming the optical component 200 including layers having different RIs on one side of the substrate 202. In some embodiments, both sides of the substrate 202 can be utilized to form layers having different RIs thereon. FIGS. 3A-3D illustrate schematic cross-sectional views of an optical component 300 during different stages according to one embodiment described herein. As shown in FIG. 3A, the substrate 202 includes a first surface 302 and a second surface 304 opposite the first surface 302. The patterned first layer 214 and the second layer 220 are formed on the first surface 302 of the substrate 202, as described in FIGS. 2A-2D. Next, a third layer 306 is formed on the second surface 304 of the substrate 202, and the third layer 306 is patterned by the stamp 206, as shown in FIG. 3B. The third layer 306 may be fabricated from the same materials as the first layer 204 (as shown in FIG. 2A). The third layer 306 may be formed by the same process as the first layer 204. The stamp 206 includes the pattern 208.

Figure 3C:
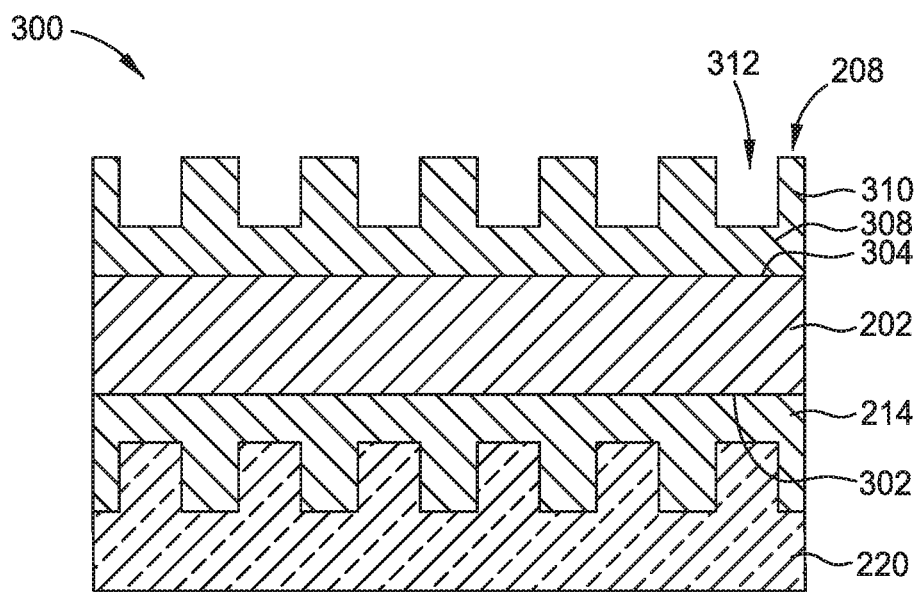
Figure 3D:
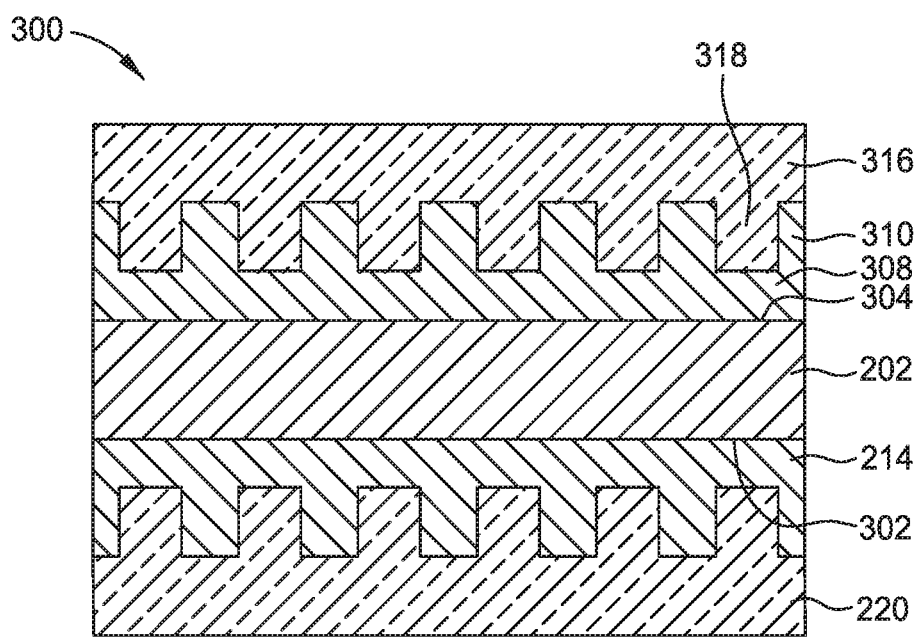

Next, as shown in FIG. 3C, the pattern 208 of the stamp 206 is transferred to the third layer 306 to form a patterned third layer 308, and the stamp 206 is removed from the patterned third layer 308. The patterned third layer 308 is cured by a curing process similar to the curing process performed on the patterned first layer 214 prior to removal of the stamp 206. The patterned third layer 308 includes a plurality of protrusions 310 and a plurality of gaps 312. Adjacent protrusions 310 are separated by a gap 312. The patterned third layer 308 may be fabricated from the same material as the patterned first layer 214 and may have the same pattern as the patterned first layer 214. In other words, the patterned third layer 308 may be identical to the patterned first layer 214. In some embodiments, the patterned third layer 308 has a different pattern than the patterned first layer 214. Next, as shown in FIG. 3D, a fourth layer 316 is formed on the patterned third layer 308 by spin coating. The fourth layer 316 may be identical to the second layer 220 and may be fabricated by the same method as the second layer 220. The fourth layer 316 includes a pattern, such as the plurality of protrusions 318. The protrusions 310 of the patterned third layer 308 and the protrusions 318 of the fourth layer 316 are alternately positioned. The optical component 300 includes layers having different RIs formed on two surfaces of the substrate 202. The optical component 300 may be used in any suitable display devices. For example, in one embodiment, the optical component 300 is used as a waveguide or waveguide combiner in augmented reality display devices. In another embodiment, the optical component 300 is used as a flat lens/meta surfaces in augmented and virtual reality display devices and 3D sensing devices, such as face ID and LIDAR.

Figure 4A:
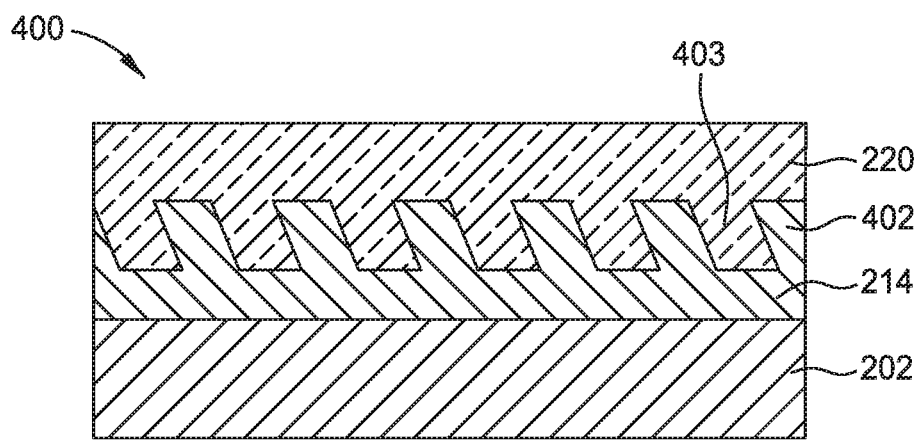
FIGS. 4A-4D illustrate schematic cross-sectional views of an optical component according to embodiments described herein.

FIGS. 4A-4D illustrate schematic cross-sectional views of an optical component 400 according to embodiments described herein. As shown in FIG. 4A, the optical component 400 includes the substrate 202, the patterned first layer 214 disposed on the substrate 202, and the second layer 220 disposed on the patterned first layer 214. The patterned first layer 214 includes a plurality of protrusions 402, and the second layer 220 includes a plurality of protrusions 403. Each of the protrusions 402, 403 has a parallelogramical cross-sectional area, as shown in FIG. 4A. The protrusions 402, 403 may be gratings.

Figure 4B:
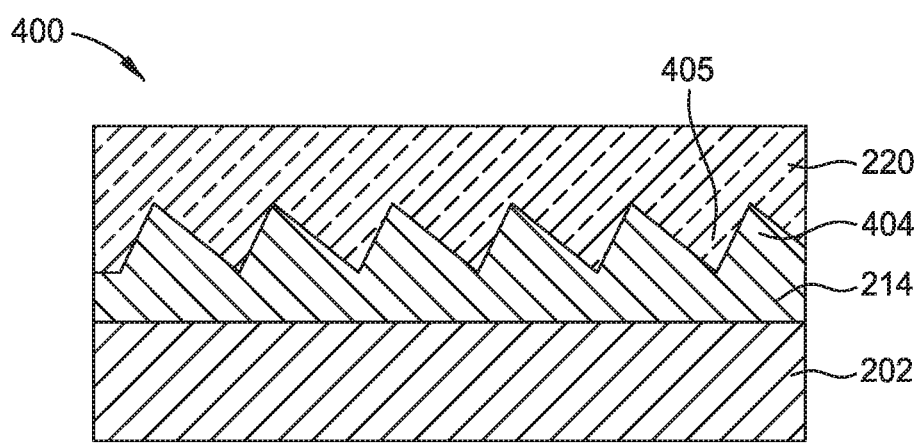

As shown in FIG. 4B, the optical component 400 includes the substrate 202, the patterned first layer 214 disposed on the substrate 202, and the second layer 220 disposed on the patterned first layer 214. The patterned first layer 214 includes a plurality of protrusions 404, and the second layer 220 includes a plurality of protrusions 405. Each of the protrusions 404, 405 has a triangular cross-sectional area, as shown in FIG. 4B. The protrusions 404, 405 may be gratings.

Figure 4C:
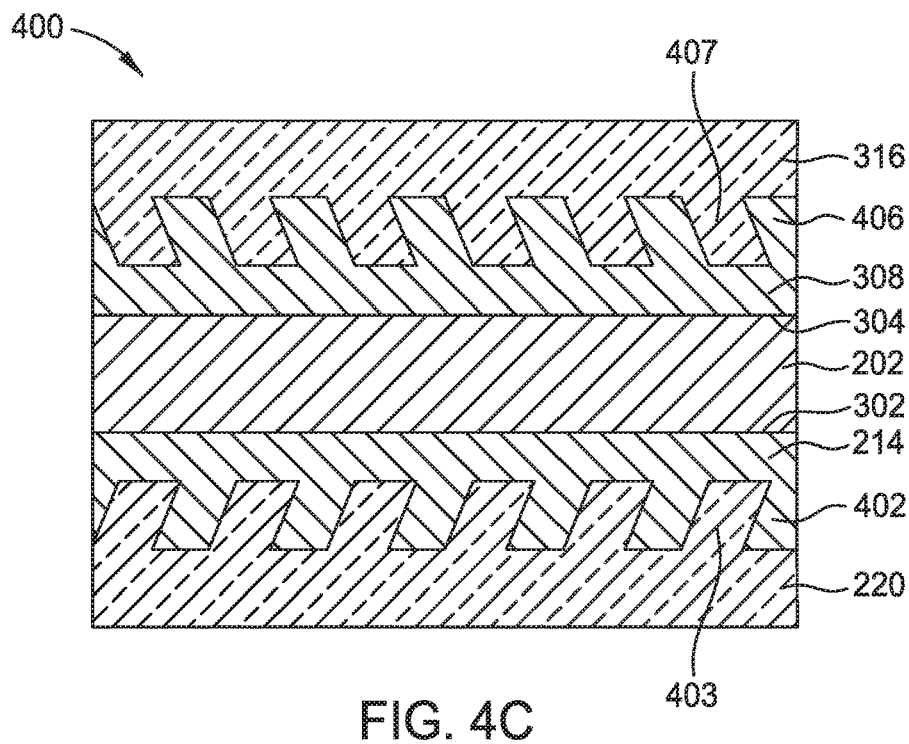

As shown in FIG. 4C, the optical component 400 includes the substrate 202, the patterned first layer 214 disposed on the first surface 302 of the substrate 202, and the second layer 220 disposed on the patterned first layer 214. The patterned first layer 214 includes the plurality of protrusions 402, and the second layer 220 includes the plurality of protrusions 403. The optical component 400 further includes the patterned third layer 308 disposed on the second surface 304 of the substrate 202 and the fourth layer 316 disposed on the patterned third layer 308. The patterned third layer 308 includes a plurality of protrusions 406, and the fourth layer 316 includes a plurality of protrusions 407. The protrusions 406, 407 may be substantially the same as the protrusions 402, 403, respectively. The protrusions 402, 403, 406, 407 may be gratings.

Figure 4D:
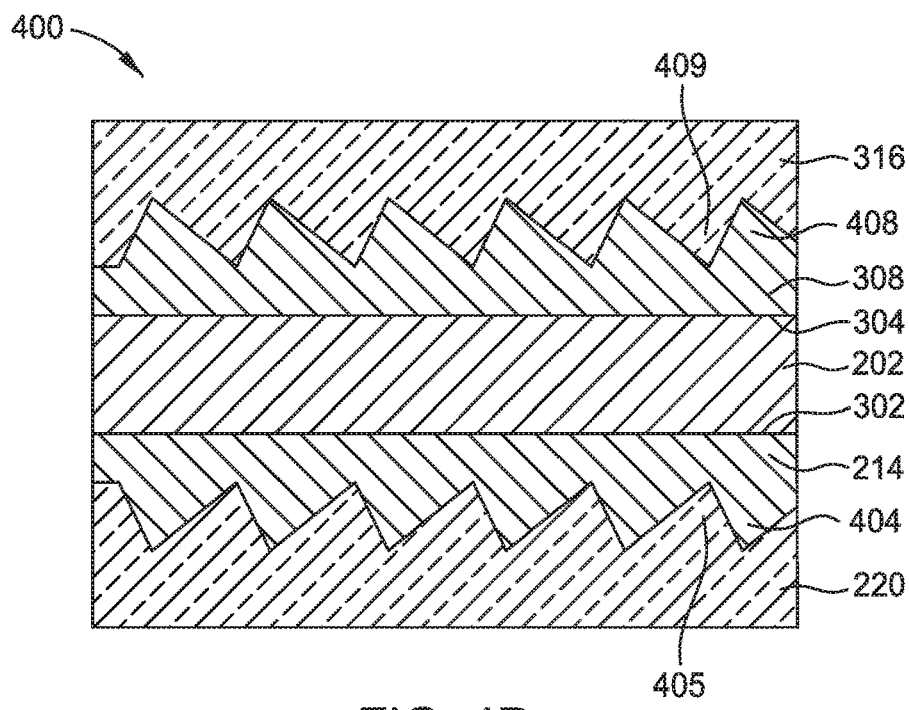

As shown in FIG. 4D, the optical component 400 includes the substrate 202, the patterned first layer 214 disposed on the first surface 302 of the substrate 202, and the second layer 220 disposed on the patterned first layer 214. The patterned first layer 214 includes the plurality of protrusions 404, and the second layer 220 includes the plurality of protrusions 405. The optical component 400 further includes the patterned third layer 308 disposed on the second surface 304 of the substrate 202 and the fourth layer 316 disposed on the patterned third layer 308. The patterned third layer 308 includes a plurality of protrusions 408, and the fourth layer 316 includes a plurality of protrusions 409. The protrusions 408, 409 may be substantially the same as the protrusions 404, 405, respectively. The protrusions 404, 405, 408, 409 may be gratings. The optical component 400 may be used in any suitable display devices. For example, in one embodiment, the optical component 400 is used as a waveguide or waveguide combiner in augmented reality display devices. In another embodiment, the optical component 400 is used as a flat lens/meta surfaces in augmented and virtual reality display devices and 3D sensing devices, such as face ID and LIDAR.

A method for forming an optical component including layers having different RIs is disclosed. A pattern is formed in the layer having a lower RI, and the layer having a higher RI is spin coated on the patterned layer with the lower RI. The spin coated layer having the higher RI has improved uniformity of nanoparticles of the high RI material. Furthermore, the layer having the higher RI is not damaged because imprinting of the layer having the higher RI using a stamp is avoided. The application of the optical component is not limited to augmented and virtual reality display devices and 3D sensing devices. The optical component can be used in any suitable applications.

While the foregoing is directed to embodiments of the present disclosure, other and further embodiments of the disclosure may be devised without departing from the basic scope thereof, and the scope thereof is determined by the claims that follow.

What is claimed is:

1. A method, comprising:
   forming a first layer having a first refractive index on a first surface of a substrate;
   pressing a stamp having a pattern onto the first layer;
   transferring the pattern to the first layer to form a patterned first layer;
   forming a second layer having a second refractive index greater than the first refractive index on the patterned first layer by spin coating; and
   forming a third layer having a third refractive index on a second surface of the substrate, the second surface being opposite the first surface of the substrate.

2. The method of claim 1, wherein the first refractive index ranges from about 1.1 to about 1.5.

3. The method of claim 1, wherein the first layer comprises porous silicon dioxide or quartz.

4. The method of claim 1, wherein the second layer comprises a metal oxide.

5. The method of claim 1, wherein the second layer comprises titanium oxide, tantalum oxide, zirconium oxide, hafnium oxide, or niobium oxide.

6. The method of claim 1, wherein the first layer is formed on the substrate by spin coating.

7. A method, comprising:
   forming a first layer having a first refractive index ranging from about 1.1 to about 1.5 on a first surface of a substrate;
   pressing a stamp having a pattern onto the first layer;
   transferring the pattern to the first layer to form a patterned first layer;
   forming a second layer having a second refractive index ranging from about 1.7 to about 2.4 on the patterned first layer by spin coating; and
   forming a third layer having a third refractive index on a second surface of the substrate, the second surface being opposite the first surface of the substrate.

8. The method of claim 7, wherein the first layer comprises porous silicon dioxide or quartz.

9. The method of claim 7, wherein the second layer comprises a metal oxide.

10. The method of claim 7, wherein the second layer comprises titanium oxide, tantalum oxide, zirconium oxide, hafnium oxide, or niobium oxide.

11. The method of claim 7, wherein transferring the pattern to the first layer comprises curing the first layer with the stamp on the first layer.

12. The method of claim 11, wherein the curing the first layer comprises UV curing or thermal curing.

13. A method, comprising:
   forming a first layer having a first refractive index on a first surface of a substrate;
   pressing a first stamp having a first pattern onto the first layer;
   transferring the first pattern to the first layer to form a patterned first layer;
   forming a second layer having a second refractive index ranging from about 1.7 to about 2.4 on the patterned first layer by spin coating, the second layer comprising a metal oxide; and
   forming a third layer having a third refractive index on a second surface of the substrate, the second surface being opposite the first surface of the substrate.

14. The method of claim 13, wherein the first layer comprises porous silicon dioxide or quartz.

15. The method of claim 13, wherein the second layer comprises titanium oxide, tantalum oxide, zirconium oxide, hafnium oxide, or niobium oxide.

16. The method of claim 13, wherein the first layer is formed on the first surface of the substrate by spin coating.

17. The method of claim 13, further comprising:
   pressing a second stamp having a second pattern onto the third layer;
   transferring the second pattern to the third layer to form a patterned third layer; and
   forming a fourth layer having a fourth refractive index greater than the third refractive index on the patterned third layer by spin coating.

18. The method of claim 17, wherein the second pattern is different from the first pattern.

* * * * *